(12) United States Patent
Behrends et al.

(10) Patent No.: US 7,502,276 B1
(45) Date of Patent: Mar. 10, 2009

(54) METHOD AND APPARATUS FOR MULTI-WORD WRITE IN DOMINO READ SRAMS

(75) Inventors: Derick G. Behrends, Rochester, MN (US); Todd A. Christensen, Rochester, MN (US); Travis R. Hebig, Rochester, MN (US); Daniel M. Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/122,185

(22) Filed: May 16, 2008

(51) Int. Cl.
*G11C 8/12* (2006.01)
*G11C 11/413* (2006.01)
*G11C 8/10* (2006.01)
*G11C 29/18* (2006.01)
*G11C 29/26* (2006.01)

(52) U.S. Cl. .............. 365/230.02; 365/230.03; 365/230.06; 365/201; 365/154

(58) Field of Classification Search ............ 365/201, 365/230.02, 230.03, 230.06, 154
See application file for complete search history.

(56) References Cited

U.S. PATENT DOCUMENTS

| | | | |
|---|---|---|---|
| 6,198,667 B1 * | 3/2001 | Joo | 365/189.04 |
| 6,370,073 B2 * | 4/2002 | Leung | 365/222 |
| 7,233,542 B2 | 6/2007 | Bunce et al. | |
| 7,336,546 B2 | 2/2008 | Chan et al. | |
| 2007/0165447 A1 | 7/2007 | Wagner et al. | |
| 2007/0258312 A1 | 11/2007 | Richards | |

* cited by examiner

*Primary Examiner*—J. H. Hur
(74) *Attorney, Agent, or Firm*—King & Spalding LLP

(57) ABSTRACT

A domino read SRAM capable of writing multiple wordlines simultaneously. A read/write multiplexer may allow conventional, single-wordline selection during a read operation, while allowing external logic, such as an ABIST controller, to enable multiple wordlines during a write operation.

1 Claim, 4 Drawing Sheets

METHOD AND APPARATUS FOR MULTI-WORD WRITE IN DOMINO READ SRAMS

FIELD OF THE INVENTION

This invention relates to semiconductor memories, and more specifically to reading and writing of domino static random-access memories, and to a design structure therefor.

BACKGROUND

Domino SRAMs are a particular class of static random-access memories, or SRAMs. SRAMs are generally capable of retaining information nearly indefinitely, as long as power is supplied, as opposed to dynamic random-access memories, or DRAMs, which must be refreshed periodically. SRAMs typically employ memory cells based on cross-coupled inverters or similar circuit arrangements. In contrast with DRAMs, which may only require one transistor per bit, SRAMs require a number of transistors which may vary from three to eight, depending on the required functionality, performance and area limitations, fabrication process, etc.

SRAMs are organized along rows (wordlines) and columns (bitlines). Rows of memory cells are activated through wordlines and data is read and written through bitlines. In standard SRAMs, a large number of cells (e.g., 128 cells) are typically connected to a single bitline. Therefore, each cell must drive a substantial parasitic capacitance, which increases read time and power consumption. To speed up the reading process, sense amplifiers are connected to the bitlines to detect small voltage swings. This allows for reading data before the bitlines experience a complete voltage transition of the order of the supply voltage. However, sense amplifiers also contribute to power consumption and consume chip area.

Examples of domino SRAMs are disclosed in U.S. Pat. Nos. 5,668,761, 5,729,501 and 6,657,886, assigned to the assignee of this application and incorporated herein by reference. In essence, the long global bitlines of a standard SRAM are partitioned into a number of short local bitlines, each connected to a cell group including a small number of cells, e.g., 4 to 16 cells. Each local bitline constitutes a node of a dynamic circuit, which is precharged to the supply voltage and discharged to ground by the memory cell's transistors. This dynamic design replaces the sense amplifier of a standard SRAM. This design style is called "domino logic" since the transition from high to low voltages at one node typically triggers more transitions down the signal path, as in a chain of dominos.

The simplification of the read path in domino SRAMs achieves higher performance and lower power consumption as compared to standard SRAMs. The small parasitic capacitance associated with each local bitline allows the cell transistors to drive large voltage swings in a short time. The large voltage swings allow single-ended sensing, which reduces the effective total capacitive load, and associated power consumption, by about 50% during readout. Moreover, single-ended sensing may be accomplished by simple local evaluation circuits, such as inverters, as opposed to complex sense amplifiers which are required for differential sensing. Each local evaluation circuit detects voltage transitions on a single local bitline. Signals from all the local evaluation circuits may be combined, e.g., by a hierarchical OR tree, to read the data out to the peripheral circuitry. The elimination of sense amplifiers and the reduction of charging/discharging currents allows a substantial improvement of the power-delay product of domino SRAMs as compared to standard SRAMs.

Most existing domino SRAM designs are inherently capable of activating only a single wordline at a time, and therefore the domino SRAM can only write a single word of data during each write cycle. This may be a disadvantage, for example, in array built-in self test (ABIST) designs. An ABIST controller may be required to initialize a complete array. With a single-word write capability, writing each and every cell in the memory array requires many write cycles. Therefore, single-word writing causes long ABIST test times and a consequent increase in the manufacturing cost of integrated circuits.

Known techniques to implement multi-word write operations also have drawbacks. For example, some SRAM architectures include a reset functionality at the memory cell level. However, this requires additional devices in each cell, which also leads to increased chip area and requires special design considerations.

SUMMARY OF THE INVENTION

In one aspect, the invention provides a domino SRAM memory array. The memory array may receive a plurality of address bits consisting of least-significant bits and most-significant bits. The memory array may comprise: a plurality of SRAM cores having wordlines; a wordline decoder receiving the least-significant bits and providing wordline selection signals to all SRAM cores in parallel; a core decoder receiving the most-significant bits and providing first core select signals; input terminals to receive second core select signals; and a read/write multiplexer receiving the first and second core select signals, and providing each of a plurality of third core select signals to a corresponding one of the SRAM cores. The third core select signals may be controlled by the first core select signals in correspondence with a read operation, and by the second core select signals in correspondence with a write operation.

BRIEF DESCRIPTION OF THE DRAWINGS

Embodiments of the invention will now be described with reference to the appended drawings in which.

Drawings are only diagrammatic and not to scale. Corresponding elements in different drawings are indicated by the same numerals.

DETAILED DESCRIPTION

Figure 1:
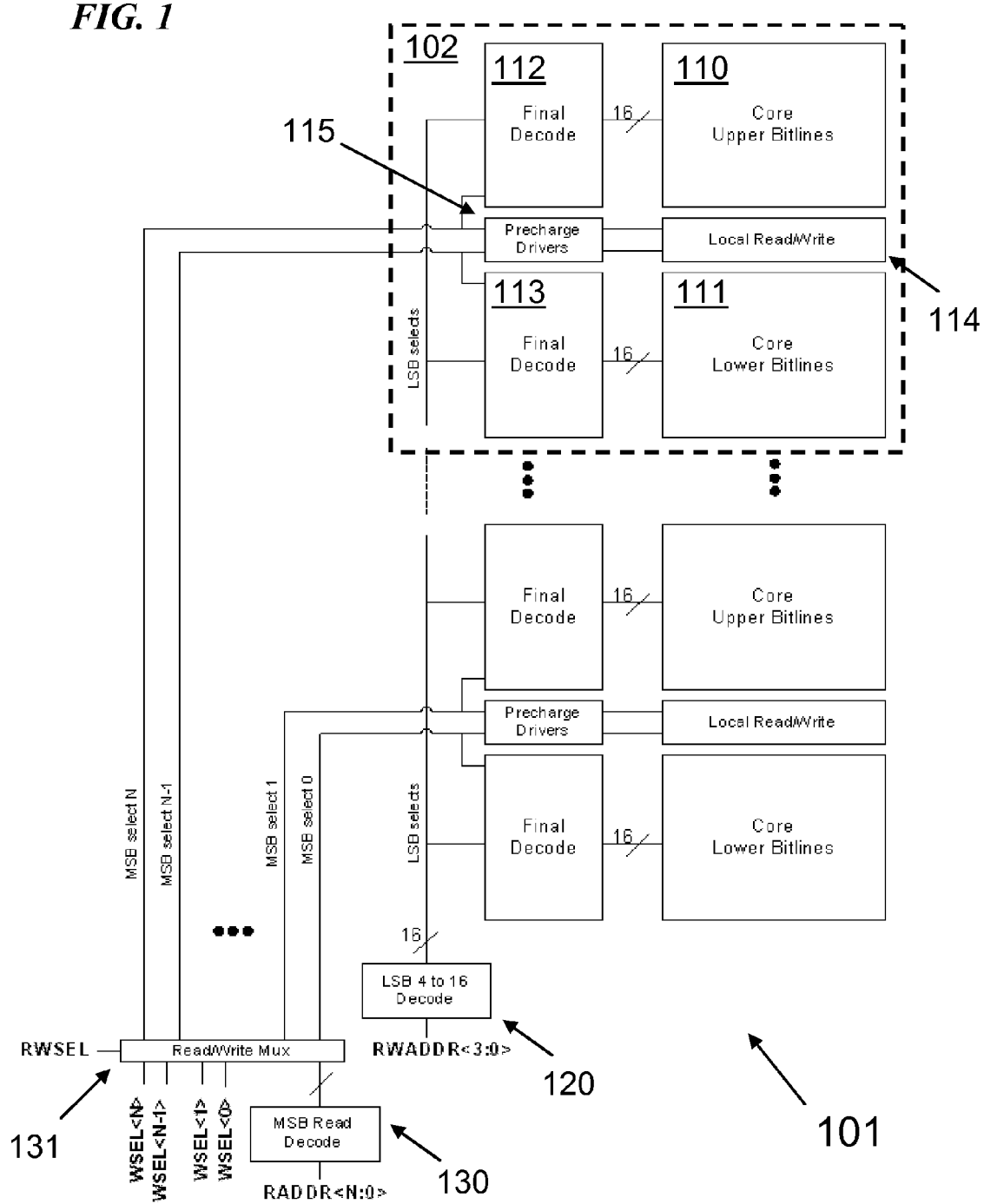
FIG. 1 shows a domino SRAM in an embodiment of the invention.

FIG. 1 shows a domino SRAM in an embodiment of the invention. Domino SRAM 101 may include a plurality of banks 102, and each bank may include two SRAM cores 110 and 111. The wordlines of each of the SRAM cores 110 and 111 may be driven by wordline drivers (final decode stages) 112 and 113, respectively. The pair of SRAM cores 110 and 111 may share a common local read/write circuit 114 and precharge drivers 115, which are connected to the bitlines of each core. An example of such mirrored arrangement is described in U.S. Pat. No. 7,336,546, assigned to the assignee of this application and incorporated herein by reference. While a mirrored arrangement of SRAM cores is preferred, it is not required for the practice of the invention. For example, each SRAM core could have its own local read/write circuit and precharge driver.

Figure 2:
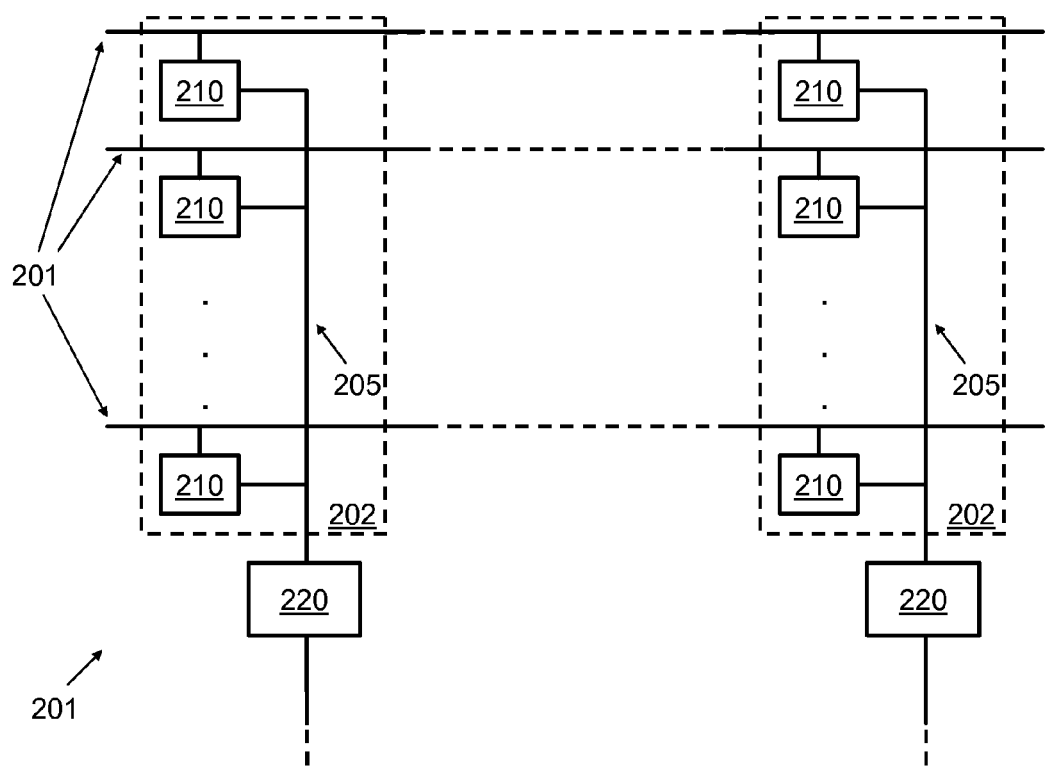
FIG. 2 shows the structure of a domino SRAM core in an embodiment of the invention.

FIG. 2 shows the structure of a domino SRAM core in an embodiment of the invention. SRAM core 201 may include a plurality of cell groups 202. Each cell group 202 may comprise a relatively small number of cells 210. In a preferred embodiment of the invention, each cell group includes 16 cells. Each of the cells 210 may have a standard SRAM circuit structure, e.g., two cross-coupled inverters with access transistors, as is well known in the art. Corresponding cells 210 of different cell groups may share a common wordline 201. All cells 210 of a cell group 202 may share a common local bitline 205. Each local bitline 205 may be connected to a local read/write circuit 220, which is also connected on the opposite side to another SRAM core (not shown) in the mirrored arrangement discussed previously with reference to FIG. 1. As explained above, the mirrored arrangement could be omitted, in which case each local read/write circuit 220 would be connected to a single local bitline 205. A precharge driver (not shown) may also be employed to precharge each local bitline 205 to a high voltage in preparation for a readout operation.

The simplified domino SRAM core of FIG. 2 is shown only for illustrative purposes, and many variations on the basic structure are known in the art. For example, FIG. 2 only shows a single bitline in each cell group. The single bitline of FIG. 2 may be used to both read and write each cell 210 in a single-ended fashion. To implement differential writing, an additional bitline may be connected to each cell to carry the complementary value of the bit being written. Also, multiple wordlines may be employed for each cell to allow separate access to the true and complementary values stored in each cell. Such variations are well known in the art.

Referring back to FIG. 1, each SRAM core 110 may be separately accessed by a most-significant-bit (MSB) select line, denoted as MSB select 0 through MSB select N. Activation of each of the MSB select lines may allow access to a corresponding SRAM core 110. In conventional domino SRAMs, at most one MSB select line is active at any time.

The final decode stages of all SRAM cores 110 may receive 16 pre-decoded signals from a common 4-to-16-bit wordline decoder 120, which is controlled by the 4 least-significant bits (LSBs) of the read/write address, denoted by RWADDR<3:0>. This allows the selection of a single wordline out of 16 different wordlines within each SRAM core, corresponding to the 4 lowest bits of the read/write address. The final decode stages may also be controlled by the MSB select lines, so that only wordlines of a selected block are activated.

In the embodiment of FIG. 1, during a read operation only one of the MSB select lines is active, since data from a single SRAM core is read out to the peripheral circuitry. In a conventional domino SRAM, only one of the MSB select lines is also active during a write operation, therefore only a single SRAM core may be written to. The embodiment of the invention shown in FIG. 1 includes a read/write multiplexer (MUX) 131 which may allow multiple SRAM cores to be written to at the same time. The read/write MUX 131 is controlled by the RWSEL signal. When RWSEL is low (i.e., the domino SRAM is performing a read operation), the read/write MUX 131 may allow the pre-decoded signals from the MSB read decoder 130 to be propagated to the MSB select lines, as in a conventional domino SRAM. When RWSEL is high (i.e., the domino SRAM is performing a write operation), the read/write MUX 131 allows inputs from lines WSEL<0> through WSEL<N> to be propagated to the MSB select lines. It is understood that the polarity of RWSEL is arbitrary, and RWSEL could be high in correspondence with a read operation and low in correspondence with a write operation.

The use of the read/write MUX 131 may allow two different access modes to the domino SRAM cores during read and write operations. In a conventional domino SRAM, both read and write operations share the same MSB decoder 130. This implies that for both read and write operations, only one MSB select line can be high, therefore only one SRAM core can be accessed for writing. By inserting the read/write MUX 131 between the MSB decoder 130 and the domino SRAM cores, MSB select lines can be individually driven by external signals during a write operation. This allows enhanced flexibility and new modes of operation for the memory array in correspondence with a write operation. For example, select lines WSEL<0> through WSEL<N> may be provided by external logic, such as an ABIST controller, to enable multiple wordlines during a write operation.

The use of the read/write MUX 131 may allow one word on each local bitline to be written with the same data. In the particular embodiment of FIG. 1, the address of each wordline being written to is the same within all SRAM cores, because the LSB wordline decoder is shared by all cores. However this is not required for the practice of the invention, and the addition of multiple wordline decoders could enable the writing of different wordlines in different SRAM cores.

Figure 3:
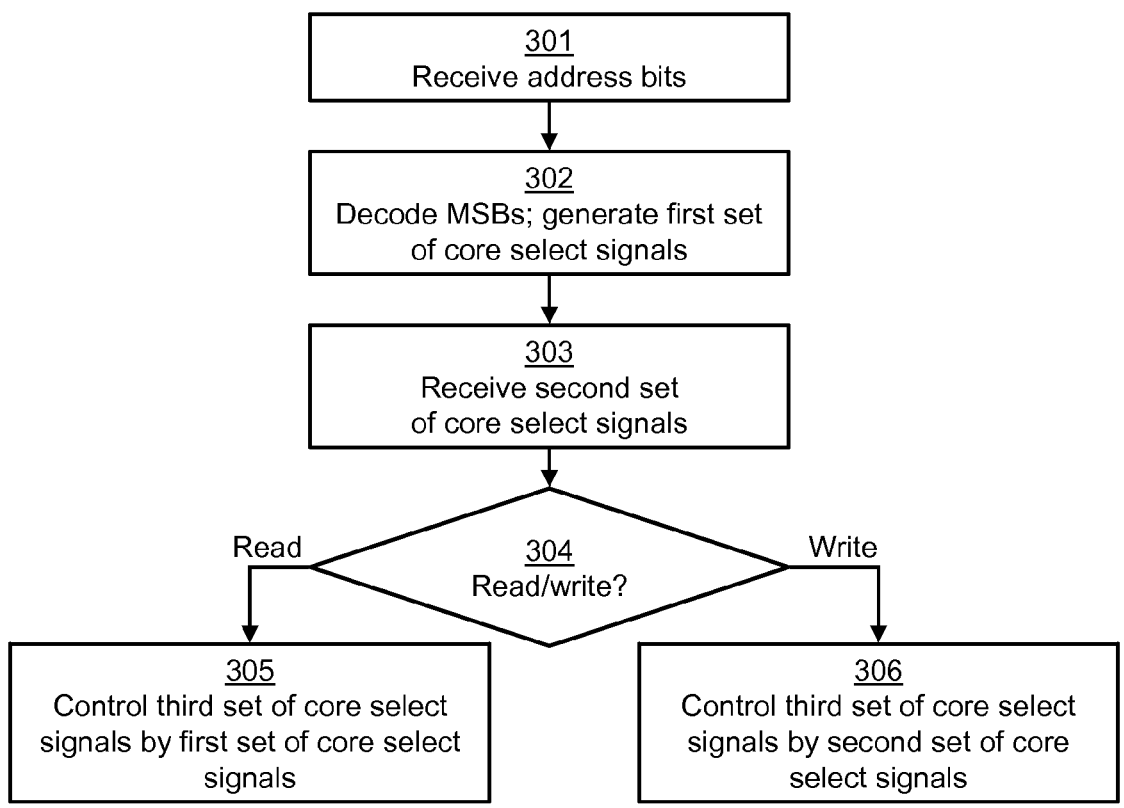
FIG. 3 shows a process to read/write a domino SRAM in an embodiment of the invention.

FIG. 3 shows a process to read/write a domino SRAM in an embodiment of the invention. The process may be carried out by a system such as that shown in FIG. 1, or by any other suitable electronic circuit, including a general-purpose processor programmed by microcode, firmware or software.

The process may start at step 301, where address bits are received. Address bits may be thought as comprising least-significant bits (LSBs) and most-significant bits (MSBs). Preferably, the division of address bits into LSBs and MSBs mirrors the physical address space as perceived by the user of the memory array, i.e., LSBs are the bits corresponding to the lowest powers of 2 in a binary representation, and MSBs are the remaining bits. However, this is not required for the practice of the invention, and the division of address bits into two groups, herein denoted as LSBs and MSBs, is essentially arbitrary. For example, for purposes of this description, LSBs may actually correspond to the uppermost bits of the address as perceived by the user of the memory array. LSBs and MSBs need not even be consecutively arranged, and in fact they could even be interleaved, where for example LSBs are the bits at even positions in the binary representation of the address, and MSBs are the bits at odd positions.

At step 302, MSBs may be decoded to generate a first set of core select signals. Decoding generally denotes the conversion of a binary code into individual signals to access single SRAM cores. In a preferred embodiment of the invention, the decoding operation converts an M-bit binary number into $2^M$ signals, where each signal selects a single core. For example, a 4-bit binary number can be used to select one of 16 SRAM cores, addressed by binary codes 0000 through 1111. It is understood that decoding is a purely logical operation, which is not linked to the physical arrangement of the SRAM cores. For example, if the SRAM includes 16 SRAM cores, a binary code of 0000 need not be used to access the first or last core in the array, but the sequence may be essentially arbitrary. Also, there is no requirement for the practice of the invention that the correspondence between binary codes and core select signals be of a conventional type, e.g., that exactly M bits be used to access $2^M$ cores. In other embodiments of the invention, different binary codes may be used, for example redundant codes having more than M bits. In yet other embodiments, a single binary code may access more than one core, thus requiring less than M bits to access $2^M$ cores.

At step 303, a second set of core select signals may be received, for example from external circuitry such as an ABIST controller. The receiving operation may include the latching and storage of the core select signals into a register or other memory element, or it may simply involve inputting the core select signals to a combinational circuit. The particular order in which step 303 are performed with respect to steps 301 and 302 is arbitrary, since the operations are essentially independent in nature. In fact, step 303 could be performed before step 301, or between steps 301 and 302.

At step 304, the process may determine whether a read operation or a write operation is being performed. In case of a read operation, at step 305 a third set of core select signals may be controlled by the first set of core select signals. The third set of core select signals may correspond, for example, to MSB select 0 through N in FIG. 2. The first set of core select signals was previously obtained by the decoding operation at step 302, and may correspond for example to the output of MSB read decoder 130 in FIG. 1. In case of a write operation, at step 306 the third set of core select signals may be controlled by the second set of core select signals. The second set of core select signals was previously obtained by the reception operation at step 303, and may correspond for example to signals WSEL<0> through <N> in FIG. 1. It is understood that the operation of "controlling" may include the simple verbatim propagation of the signals through a multiplexer such as the read/write MUX 131 of FIG. 1, or it may include some intermediate logic operation such as gating, inversion, AND, OR, XOR, etc.

The multiple-wordline write capabilities of this embodiment of the invention allow an array with a 16 cell local bitline to be completely written in 16 cycles per bit-decode level. For example, a conventional SRAM with 256 total wordlines (i.e., 8 SRAM cores, in the structure of FIG. 1) and a bit-decode of 2 would require 512 cycles to write the complete address space. This embodiment of the invention is able to write this configuration in only 32 cycles, two cycles for each of the 16 wordlines.

The multi-write enabled domino SRAM in this embodiment of the invention provides an improvement in the efficiency of CPU architectures and test methodologies, due to the reduced number of write cycles required to accomplish various tasks. For example, multi-write capabilities may greatly reduce test time by writing multiple cells in parallel. Also, the use of multi-write capabilities to reset the domino SRAM array may eliminate the need for a dedicated cell-level reset feature, allowing the design to be implemented using standard SRAM cells rather than more complex cells including a reset functionality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 4:
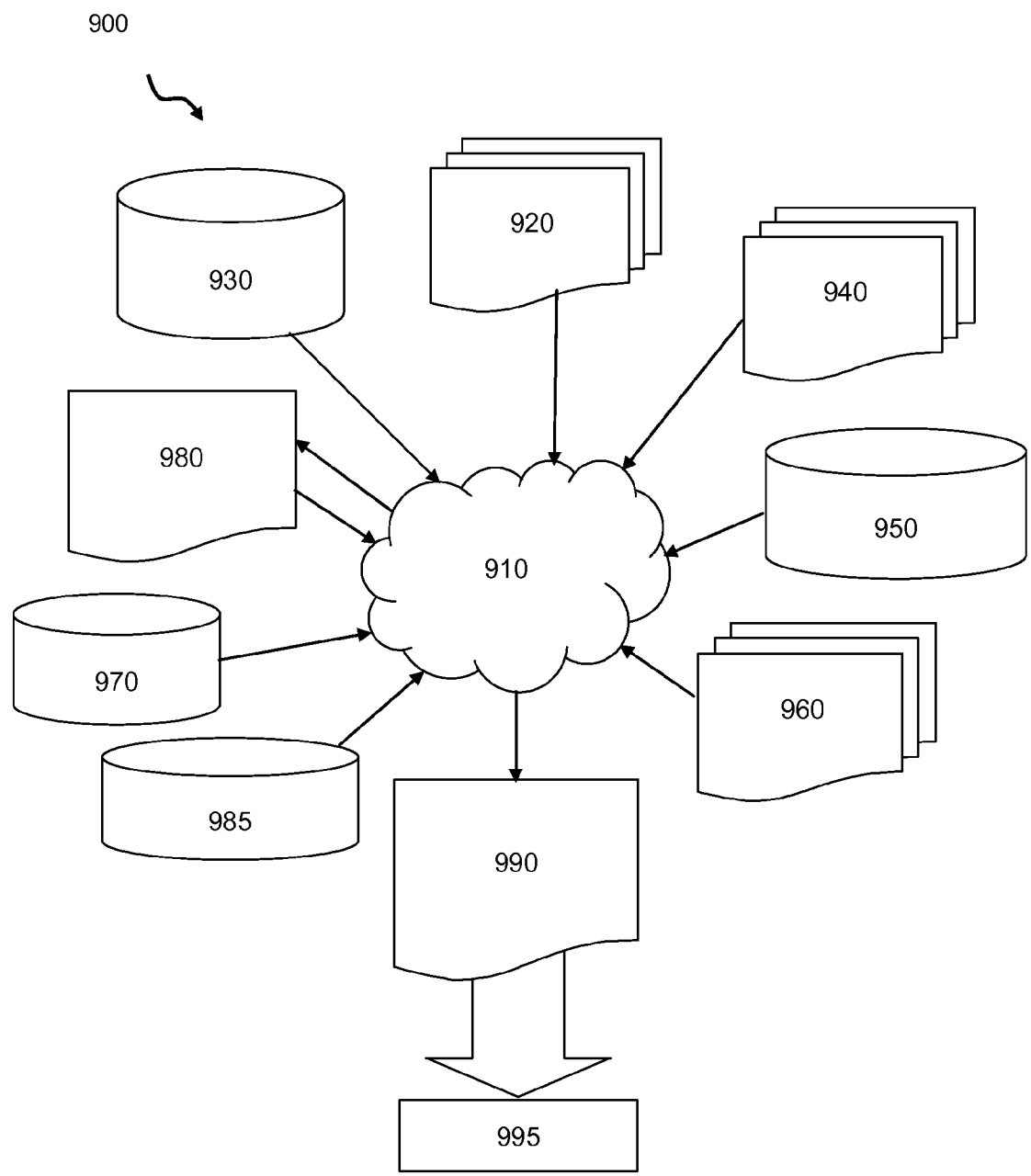
FIG. 4 is a flow diagram of a design process used in semiconductor design, manufacture, and/or test.

FIG. 4 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-3 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1-3. Design process 910 preferably synthesizes (or translates) an embodiment of the invention as shown in FIGS. 1-3 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-3, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 990 may then proceed to a stage 995 where, for example, design structure 990: proceeds to tape-out, is released to manufacturing, is released to a mask house, is sent to another design house, is sent back to the customer, etc.

While the invention has been described in conjunction with specific embodiments, it will be appreciated that such embodiments are not limiting. Accordingly, numerous alternatives, modifications, and variations are possible within the scope of the appended claims.

What is claimed is:

1. A domino SRAM memory array, the memory array receiving a plurality of address bits consisting of least-significant bits and most-significant bits, the memory array comprising:
   a plurality of SRAM cores having wordlines;
   a wordline decoder receiving the least-significant bits and providing wordline selection signals to all SRAM cores in parallel;
   a core decoder receiving the most-significant bits and providing first core select signals;
   input terminals to receive second core select signals; and
   a read/write multiplexer receiving the first and second core select signals, and providing each of a plurality of third core select signals to a corresponding one of the SRAM cores;
   wherein the third core select signals are controlled by the first core select signals in correspondence with a read operation, and by the second core select signals in correspondence with a write operation.

* * * * *